US006806733B1

(12) United States Patent
Pan et al.

(10) Patent No.: US 6,806,733 B1
(45) Date of Patent: Oct. 19, 2004

(54) MULTIPLE DATA RATE INTERFACE ARCHITECTURE

(75) Inventors: Philip Pan, Fremont, CA (US); Chiakang Sung, Milpitas, CA (US); Joseph Huang, San Jose, CA (US); Yan Chong, Mountain View, CA (US); Bonnie I. Wang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 34 days.

(21) Appl. No.: 10/038,737

(22) Filed: Jan. 2, 2002

Related U.S. Application Data

(60) Provisional application No. 60/315,879, filed on Aug. 29, 2001.

(51) Int. Cl.[7] ............................................. H03K 19/177
(52) U.S. Cl. .............................. 326/41; 326/38; 326/39; 326/47
(58) Field of Search ................................. 326/37–41, 47

(56) References Cited

U.S. PATENT DOCUMENTS

| | | | |
|---|---|---|---|
| 5,555,214 A | 9/1996 | Sung et al. | |
| 5,633,830 A | 5/1997 | Sung et al. | |
| 5,764,080 A | 6/1998 | Huang et al. | |
| 5,802,540 A | 9/1998 | Sung et al. | |
| 5,828,229 A | 10/1998 | Cliff et al. | |
| 5,970,255 A | 10/1999 | Tran et al. | |
| 6,011,744 A | 1/2000 | Sample et al. | |
| 6,049,255 A | 4/2000 | Hagberg et al. | |
| 6,100,713 A | 8/2000 | Kalb et al. | |
| 6,128,692 A | 10/2000 | Sung et al. | |
| 6,147,520 A | 11/2000 | Kothandaraman et al. | |
| 6,236,231 B1 | 5/2001 | Nguyen et al. | |
| 6,252,419 B1 | 6/2001 | Sung et al. | |
| 6,472,904 B2 * | 10/2002 | Andrews et al. | 326/38 |
| 6,525,565 B2 * | 2/2003 | Young et al. | 326/46 |

OTHER PUBLICATIONS

LVDS I/O Interface for Gb/s–per–Pin Operation in 0.35–$\mu$m CMOS, Boni, et al., *IEEE Journal of Solid–State Circuits*, vol. 36, No. 4, Apr. 2001.
CMOS VLSI Implementation of Gigabyte/Second Computer Network Links, Bendak et al., Dept. of Electrical and Computer Engineering, University of California at San Diego, La Jolla, CA 92093–0407, *IEEE International Symposium on Circuits and Systems*, 1996.
APEX II ProgrammableLogic Device Family, *A–DS–APEXII–1.1*, ver. 1.1, May 2001, Altera Corporation, San Jose, CA.
APEX 20K Programmable Logic Device Family, *A–DS–APEX20K–03.7*, , ver. 3.7, May 2001, Altera Corporation, San Jose, CA.
Virtex–II 1.5V Field–Programmable Gate Arrays, *DS031–2 (v1.5)*, Apr. 2, 2001, Xilinx, Incorporated, San Jose, CA.
Michael B. Bendak et al., "CMOS VLSI Implementation of Gigabyte/Second Computer Network Links", IEEE, 1996.
"Virtex–II 1.5V Field–Programmable Gate Arrays", XILINX, DS031–2 (v1.5), Apr. 2, 2001.
Andrea Boni et al., "LVDS I/O Interface for Gb/s–per–Pin Operation in 0.35–$\mu$m CMOS" IEEE Journal of Solid–State Circuits, vol. 36, No. 4, Apr. 2001.
"APEX II Programmable Logic Device Family", Altera Corporation, May 2001.
"APEX 20K Programmable Logic Device Family", Altera Corporation, May 2001.

* cited by examiner

*Primary Examiner*—Anh Tran
(74) *Attorney, Agent, or Firm*—Babak S. Sani; Townsend and Townsend and Crew LLP

(57) ABSTRACT

Method and circuitry for implementing high speed multiple-data-rate interface architectures for programmable logic devices. The invention partitions I/O pins and their corresponding registers into independent multiple-data rate I/O modules each having at least one pin dedicated to the strobe signal DQS and others to DQ data signals. The modular architecture facilitates pin migration from one generation of PLDs to the next larger generation.

16 Claims, 5 Drawing Sheets

US 6,806,733 B1

MULTIPLE DATA RATE INTERFACE ARCHITECTURE

CROSS-REFERENCES TO RELATED APPLICATIONS

This application is related to commonly-assigned, co-pending U.S. patent application Ser. No. 10/037,861, filed Jan. 12, 2002, entitled "Self-Compensating Delay Chain for Multiple Data-Rate Interfaces," by Chong et al., which is hereby incorporated by reference in its entirety.

BACKGROUND OF THE INVENTION

The present invention relates in general to input/output (I/O) interface in integrated circuits, and in particular to method and circuitry for distributing clock signals in a programmable logic device (PLD) that employs a multiple data rate interface.

To address the data bandwidth bottleneck in the interface between integrated circuits, high speed interface mechanisms have been developed which have helped increase the speed of data transfer and data throughput. In a multiple data rate interface scheme, two or more bits of data are transferred during each clock period. One example of multiple data rate is the so called double data rate, or DDR, technology, which performs two data operations in one clock cycle and achieves twice the throughput of data. This technology has enhanced the bandwidth performance of integrated circuits used in a wide array of applications from computers to communication systems. The DDR technique is being employed in, for example, today's synchronous dynamic random access memory (SDRAM) circuits.

The basic DDR implementation processes I/O data (also referred to as DQ signals) using both the rising edge and the falling edge of a clock signal DQS that functions as a data strobe to control the timing of data transfer. FIG. 1 shows the timing relationship between DQS and DQ signals. DQS is normally edge-aligned with DQ for a DDR interface operating in read mode (i.e., when receiving data at the I/Os). For optimum sampling of the data, internal to the integrated circuit, DQS is delayed by ¼ of the clock period to achieve a 90 degree phase shift between the edges of DQ and DQS. This ensures that the DQS edge occurs as close to the center of the DQ pulse as possible as shown in FIG. 1. It is desirable to implement this 90 degree phase shift as accurately and in as stable a manner as possible. However, typical phase shift techniques that use, for example, delay chains, are highly susceptible to process, voltage, and temperature (PVT) variations. In addition, typical DDR timing specifications require a wide frequency range of operation from, e.g., 133 MHz to 200 MHz. This places further demands on the performance of the phase shift circuitry. Another factor that affects DQS strobe timing is the skew between DQS and DQ. In general, for improved timing accuracy it is desirable to minimize this skew as much as possible.

The programmable logic technology has also seen an increased demand for this type of multiple data rate interface. Some of the above constraints, however, are exacerbated when implementing a DDR interface in a PLD. In a typical PLD configuration, the DQS signal is first applied to a phase locked loop (PLL) to generate the required phase shift and alignment. The DQ signals are applied directly to respective I/O registers whose clock inputs receive the phase-corrected DQS signal. There are inherent delays in the routing of the DQS signal from the DQS pin to the PLL and then to the I/O registers, where the I/O registers can be very large in numbers located at varying distances. These delays contribute to the undesirable skew between DQS and DQ. Also, the same PLD may be configured to operate at any frequency in the DDR frequency range and thus must accommodate the various clock speeds. Yet another concern is the ever aggressive increase in density and number of I/Os that is typical of the PLD technology as it moves from one generation to the next. To speed up the time-to-market cycles for future PLDs, it is desirable to devise an interface architecture that facilitates pin migration from one product family to the next.

BRIEF SUMMARY OF THE INVENTION

The present invention provides method and circuitry for implementing high speed multiple-data-rate interface architectures for programmable logic devices. In one embodiment, the invention employs a delay chain with precise phase shift control to achieve the desired phase shift in the data strobe DQS signal. I/O pins and their corresponding registers are divided into groups, with each group having at least one pin dedicated to the DQS signal and others to data (DQ) signals. An incoming DQS signal goes through the desired phase shift (e.g., 90 degrees) controlled by the phase shift control circuit, and drives a local clock interconnect line that connects to the I/O registers within the group. To facilitate efficient pin migration, in one embodiment, the invention partitions banks of I/O cells into smaller sections or groups. Each I/O section forms an independent multiple-data-rate I/O interface unit or module with dedicated DQS resources (pin, phase delay and clock line). Each module is designed such that as the number of I/O cells increases from one generation device to the next, the module can easily be scaled in size to facilitate the implementation of larger PLDs.

Accordingly, in one embodiment, the present invention provides a programmable logic device (PLD) including input/output (I/O) interface having a first plurality of I/O registers, the first plurality of I/O registers being partitioned into a second plurality of I/O sections each I/O section having N data I/O registers and a strobe circuit configured to drive a local clock line coupled to clock inputs of the N data I/O registers, the N data I/O registers and the strobe circuit in each I/O section being coupled to a corresponding number of device pins; and programmable logic circuitry coupled to the I/O interface. The strobe circuit in each I/O section is configured to programmably shift a phase of an input strobe signal. The PLD further includes a master phase control circuit coupled to receive a system clock signal and configured to generate a phase control signal that controls the amount of phase delay in the strobe circuits in the second plurality of I/O sections.

In another embodiment, the present invention provides a computing system including a multiple-data rate memory circuit coupled to a programmable logic device (PLD) via an interconnect bus, wherein the PLD is of the type described above.

In yet another embodiment, the present invention provides a method of operating a PLD including receiving N groups of data bits each group having M data signals and a corresponding data strobe signal; partitioning I/O register blocks inside the PLD into a corresponding N I/O modules, each module having M I/O register blocks and a strobe circuit coupled to receive a respective group of M data signals and data strobe signal; driving clock inputs of the M I/O register blocks in each of the N I/O modules using an independent clock network that is local to each of the N I/O modules.

The following detailed description and the accompanying drawings provide a better understanding of the nature and advantages of the programmable logic device according to the present invention.

DETAILED DESCRIPTION OF THE INVENTION

Figure 1:
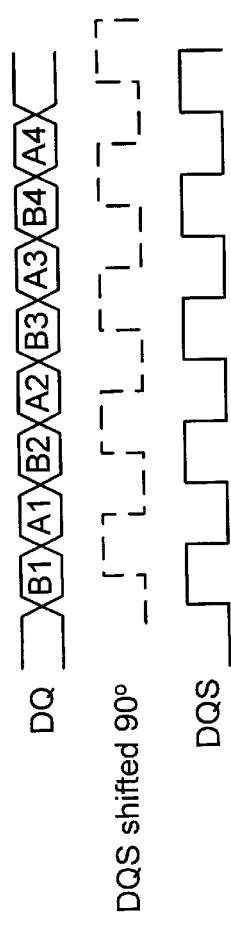
FIG. 1 is a timing diagram illustrating the relationship between data DQ and data strobe signal DQS in a double-data rate operation.
Figure 2:
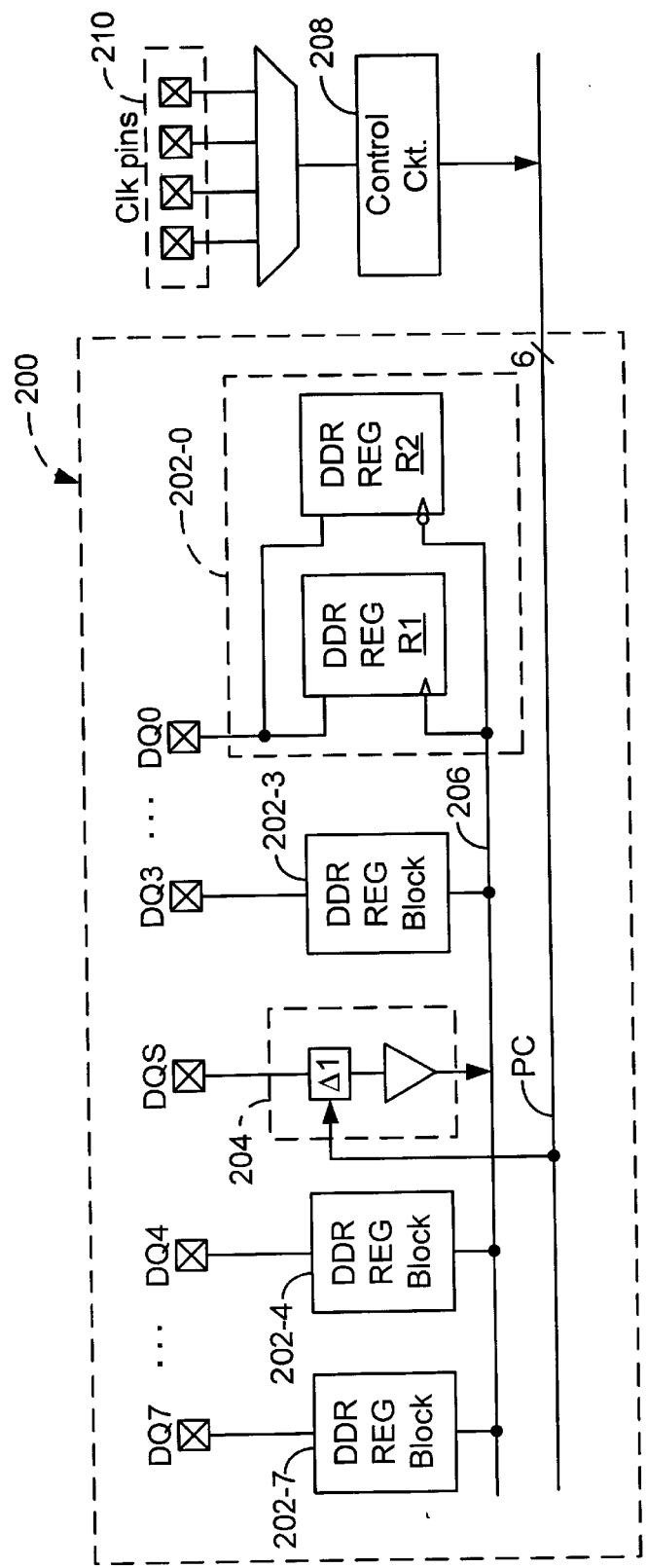
FIG. 2 is a block diagram of an exemplary I/O module for a PLD configured for double-data-rate operation according to one embodiment of the present invention.

To minimize skew, accommodate a wide frequency range of operation, and facilitate rapid pin migration to larger PLDs, the present invention provides a modular multiple-data-rate I/O architecture that can be readily replicated and scaled. For illustrative purposes, the invention is described in the context of a double-data rate (DDR) system. It is to be understood, however, that the principles of this invention can be applied to systems operating at quad-data rate or higher. Referring to FIG. 2, there is shown a block diagram of an I/O module 200 for a PLD configured for DDR operation according to one embodiment of the present invention. In this embodiment, DDR interface module 200 includes a number of, in this example eight, data I/O cells each having a data I/O pin DQ and a DDR register block 202 made up of a pair of data registers R1 and R2. Module 200 also includes a strobe input cell which is preferably located at a central location vis a vis other I/O cells, and includes a strobe signal pin DQS and phase delay circuit 204. Phase delay circuit 204 causes a 90 degree phase shift in the input strobe signal DQS and applies the phase shifted strobe signal to the module clock net 206 that is a local clock line dedicated to the I/O registers cells inside module 200. Local clock net 206 has programmable connection to drive all input registers of register blocks 202 in the DDR interface group. Thus, this DDR clock scheme allows for maintaining the clock skew between DQ and DQS to remain within a controllable range. The overall PLD I/O architecture includes multiple modules 200 each of which has its own DQS resources (DQS pin, phase shift circuit 204, and local clock net 206).

Phase shift circuit 204 is a programmably controlled delay chain that adjusts its delay in response to phase control signal PC. Phase control signal PC is a multi-bit (e.g., 6 bit) binary signal that is supplied by a master phase control circuit 208. Master phase control circuit 208 operates in response to a system clock arriving at any one of multiple clock pins 210, and is shared by a number of modules 200. In one embodiment, master phase control circuit 208 is a delay-locked loop (DLL) that takes into account the PLD operating frequency, PVT variations as well as contributions by other potential sources of delay to generate control signal PC to achieve the desired 90 degree phase shift locally in the various DDR I/O modules 200. Various embodiments for master control circuit 208 and phase shift circuit 204 are described in greater detail in the above-referenced commonly-assigned, co-pending patent application Ser. No. 10/037,861, filed Jan. 12, 2002 (Attorney Docket No. 015114-054810US/A721). entitled "Self-Compensating Delay Chain for Multiple Data-Rate Interfaces," by Chong et al.

It is to be understood that module 200 is a specific example described herein for illustrative purposes only. Many different variations and alternatives are possible. For example, the number of I/O cells in each module 200 may vary depending on the application. In some embodiments, a module 200 may include non-DDR I/O registers. That is, a DDR interface module 200 may include, for example, eight DDR register blocks 202 plus several additional general-purpose I/O registers to add further flexibility. In a variation of this embodiment where all I/O cells and the strobe input cell are designed identically, any eight cells within the module can be selected to be DDR DQ cells, while the cell that is as close to the center as possible would be selected as the DQS cell. In this embodiment, the DQS cells that include data registers can be used as other normal data registers in non-DDR applications. In such an embodiment, the DQS cell can be programmably configured to have the DQS pin connect to phase shift circuit 204 (in case of a DDR application), or alternatively to normal I/O registers (in case of non-DDR application). In applications with higher data rates (e.g., quad data rate), module 200 may include more than one DQS cell, and DDR register blocks 202 may include more than two (e.g., four) registers.

Figure 3:
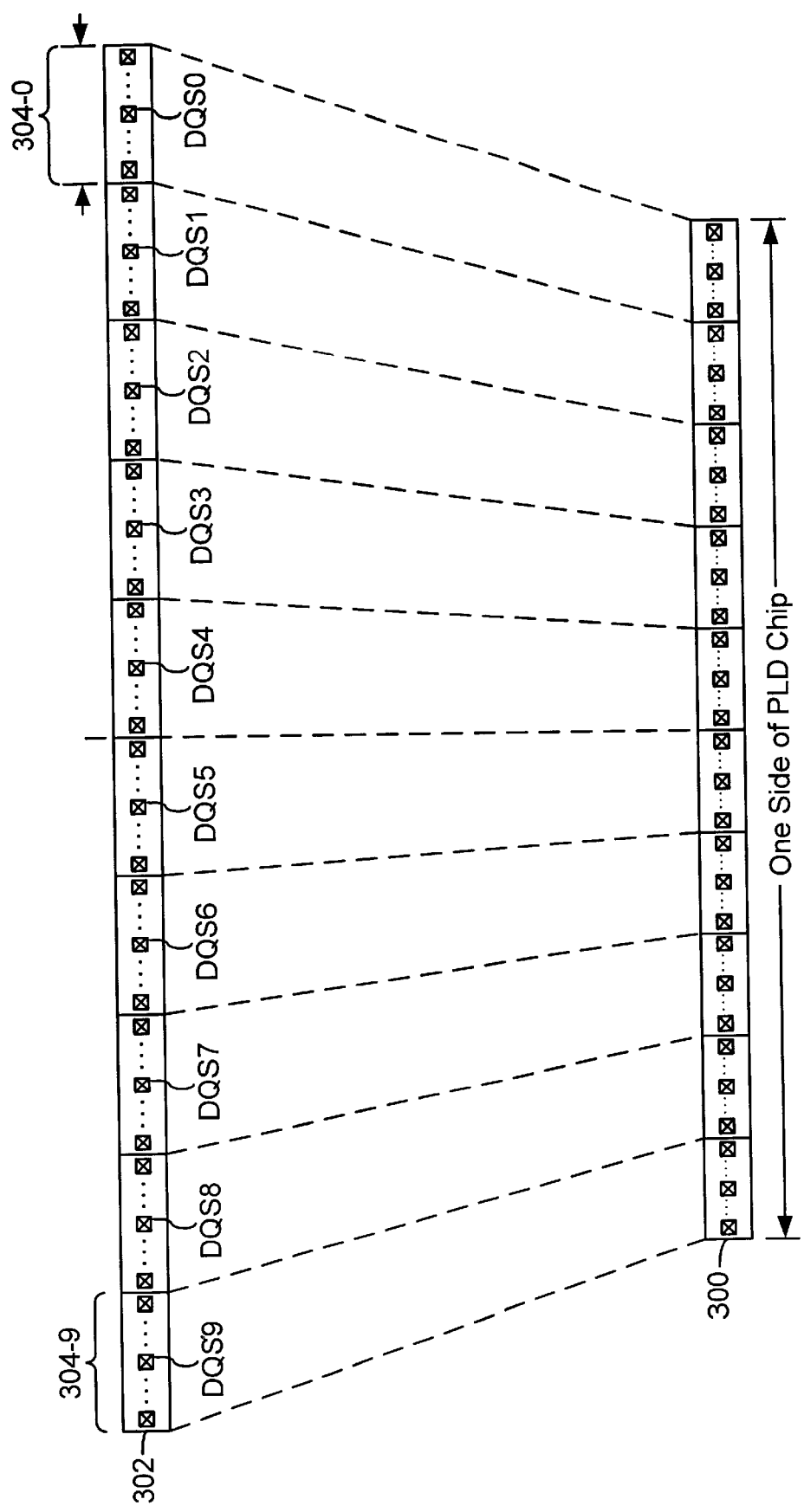
FIG. 3 is a simplified diagram illustrating an I/O architecture along one edge of a PLD according to an exemplary embodiment of the invention.

Another advantage of the multiple-data-rate interface architecture for a PLD according to the present invention is that it allows the I/O structure to be easily scaled to a higher pin count for larger PLDs. FIG. 3 shows the I/O bank along one edge of a PLD die for two devices, 300 and 302. In this example, PLD 300 represents the smallest device in a PLD product family and PLD 302 is the largest. Both I/O banks of PLD 300 and PLD 302 are partitioned into a fixed number, e.g., 10, of DDR I/O sections 304-0 to 304-9. An exemplary embodiment for the internal resources of a DDR I/O section 304 is shown in FIG. 2. In any given PLD, each I/O section 304 includes the same number of I/O cells, e.g., 10, while for different PLDs this number will vary up to, e.g., 35. Regardless of the size of the PLD, however, each DDR I/O section 304 forms a single DDR interface module with independent DQS resources. That is, each DDR I/O section 304, whether in the smallest device in the family or the largest, includes at least one DQS pin and its associated circuitry, multiple, e.g., eight DQ pins and DQ registers, and one local clock net as shown, for example, in FIG. 2. Once again, those skilled in the art will appreciate that the I/O bank according to the present invention need not necessarily include 10 DDR I/O sections 304, and may instead include fewer or larger number of sections.

The flexibility afforded by the I/O architecture of the present invention speeds up the time-to-market cycle for new and larger PLDs. When designing a next generation PLD, because of the uncertainty regarding the eventual die size as well as the package hardware restrictions, the designer is unable to decide on the location of DQ and DQS pins until the end of the design cycle. This adds further delays to the design cycle. The present invention essentially eliminates this delay by providing a modular I/O architecture that can be easily scaled such that the boundaries of each I/O section can still be defined at an early design stage. According to one embodiment of the invention, the DDR I/O section may have a number of I/O registers that is larger than the minimum (e.g., 8) required for a particular multiple-data-rate (e.g., DDR) system. With pre-defined boundaries, however, the sections can be placed while final DQS locations can be decided at a later time from one of multiple possible pins in the DDR I/O section followed by the DQ and local clock net.

Figure 4:
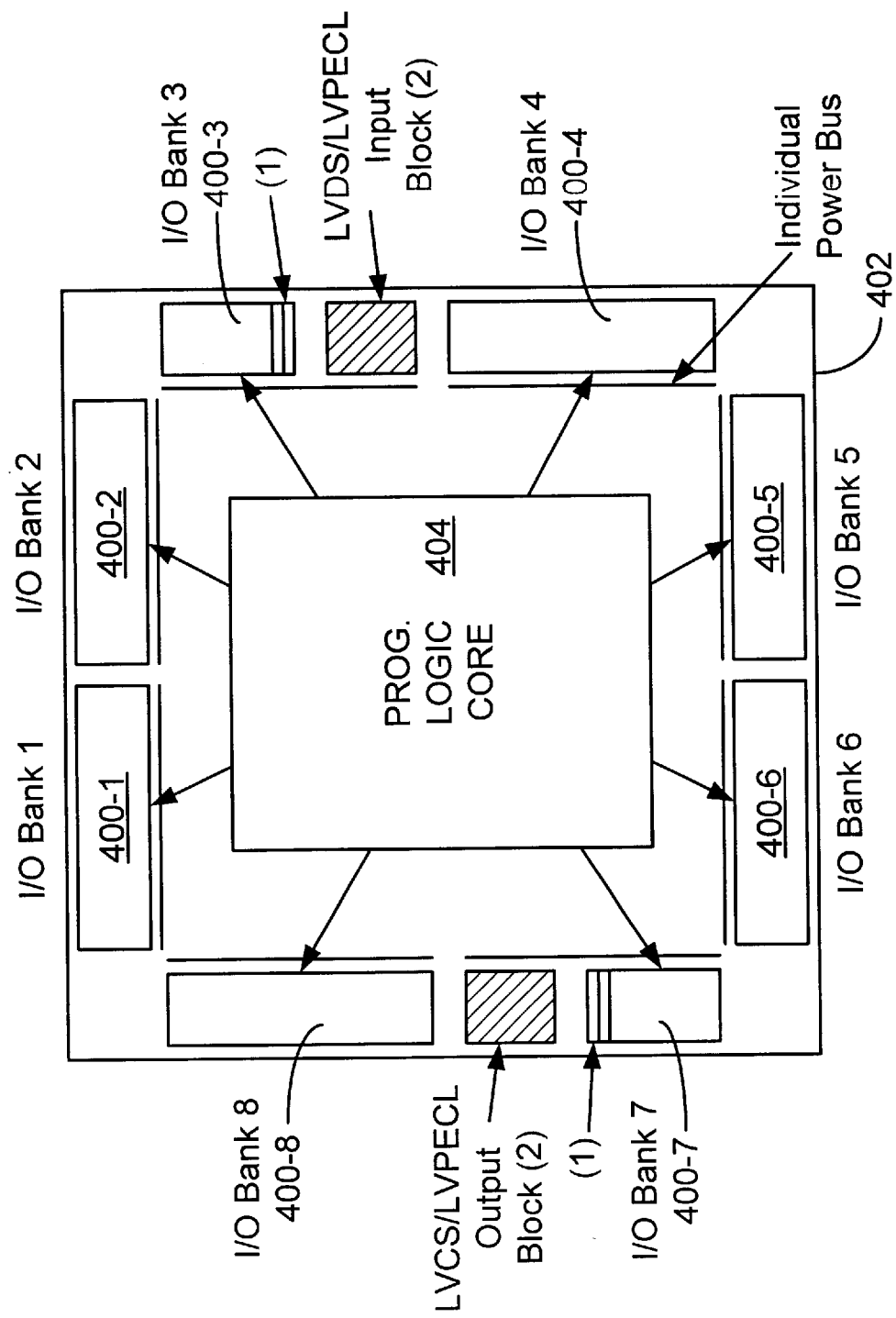
FIG. 4 shows an exemplary layout architecture for a PLD according to the present invention.
Figure 5:
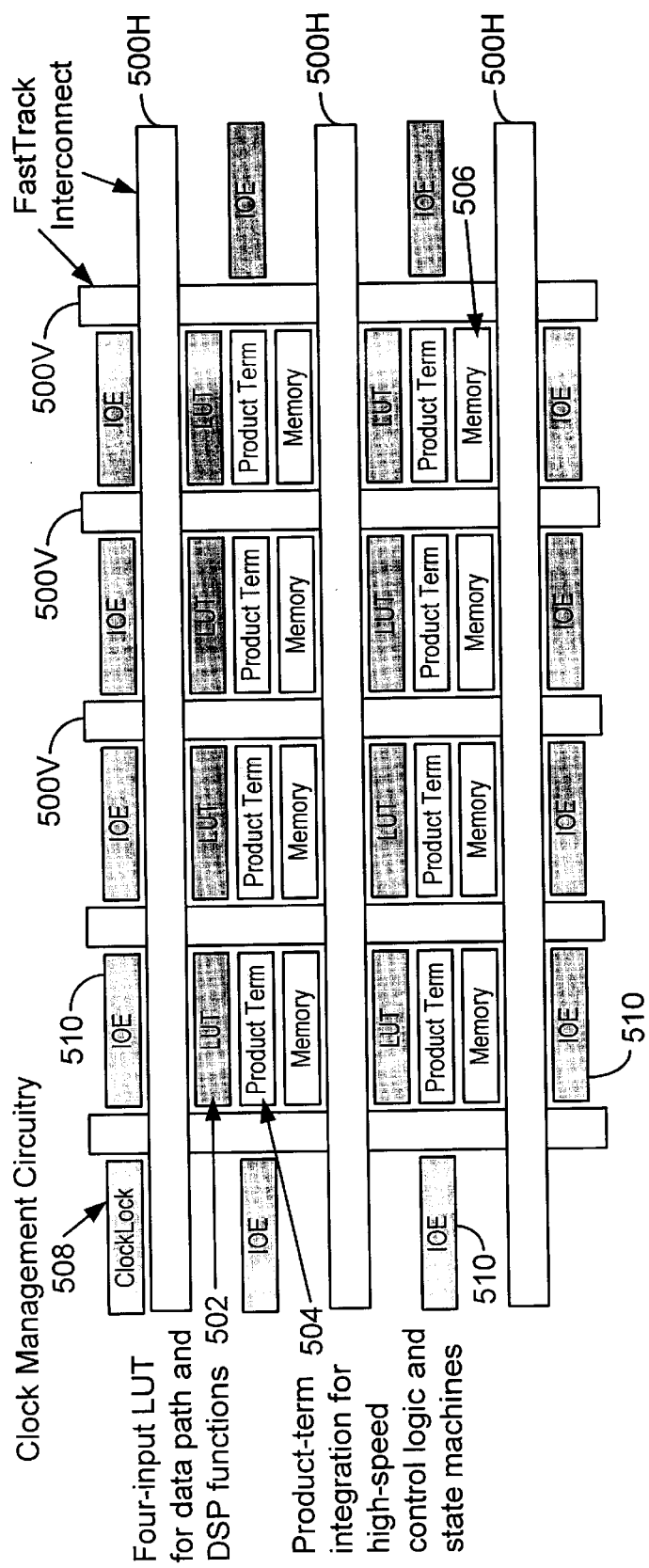
FIG. 5 is a block diagram of the internal circuitry of a PLD according to an exemplary embodiment of the present invention.

The exemplary I/O banks depicted in FIG. 3 show those along one edge of a PLD die. The modular nature of the I/O architecture of the present invention allows for many different variations in how the I/O banks are employed. Referring to FIG. 4, there is shown one example of a PLD simplified layout architecture. In this example, eight I/O banks 400 are placed in pairs along each edge of PLD die 402. Each bank 400 may be similar to the one shown in FIG. 3. I/O banks 400 connect to programmable logic core 404. Depending on the particular implementation, the PLD may include multiple master phase control circuits (208 in FIG. 2) that are shared by various combination of banks. For example, one master phase control circuit maybe used per bank to drive the DQS phase shift circuitry in each DDR I/O section within that bank. For the embodiment shown in FIG. 4, that would result in eight master phase control circuits. Alternatively, a pair of banks along each edge of the die could share one master phase control circuit. Programmable core logic 404 may be implemented using a variety of different architectures. One example of PLD core logic architecture is shown partially in FIG. 5. The PLD according to this example includes a network of fast track interconnect lines 500H and 500V that provide programmable interconnection between logic and memory resources that are arranged in blocks defined by the interconnect lines. These blocks may include look-up table (LUT) logic 502 for data path and digital signal processing functions, product term logic 504 for high-speed control logic and state machines, as well as memory 506. Other peripheral circuitry such as clock management circuit and I/O drivers 510 may also be included. A more detailed description of a PLD of the type shown in FIG. 5 can be found in data books published by Altera Corporation, and in particular the APEX II PLD family, which is hereby incorporated by reference. It is to be understood, however, that the invention is not limited to a particular type of PLD architecture and that the modular multiple-data-rate I/O architecture of the present invention can be utilized in any type of programmable logic device, many variations of which are described in Altera Corporation data books.

Figure 6:
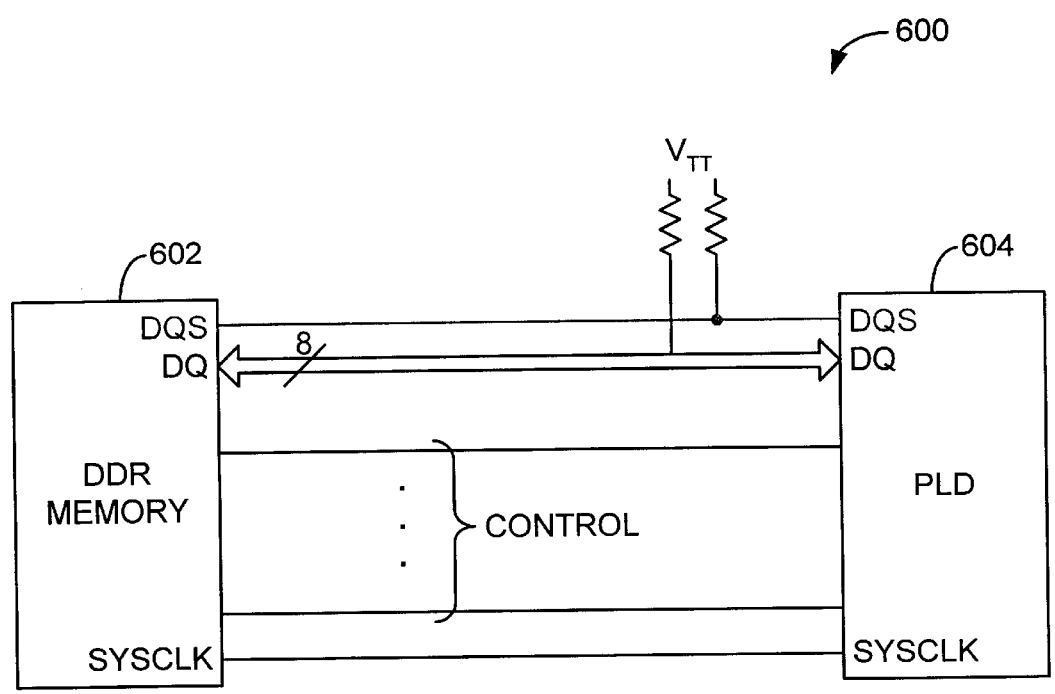
FIG. 6 is a block diagram of an exemplary computing system that employs a multiple-data-rate PLD according to an embodiment of the present invention.

FIG. 6 is a block diagram of a computing system 600 that includes a multiple-data rate memory device 602 connected to a PLD 604 according to the present invention. In this example, memory device 602 may be a double-data rate synchronous dynamic random access memory (DDR SDRAM) device that bundles, e.g., eight DQ data lines with each DQS strobe line. The interconnect between memory device 602 and PLD 604 may include multiple sets of DQ/DQS lines. Memory device 602 also supplies a system clock SYSCLK to PLD 604 in addition to other control signals. PLD 604 is designed with the modular DDR I/O interface as described above. PLD 604 may be configured to perform any user-defined functionality such as a microprocessor, digital signal processor, network processor, or the like.

In conclusion, the present invention provides method and circuitry for implementing high speed multiple-data-rate interface architectures for programmable logic devices. The invention partitions I/O pins and their corresponding registers into independent multiple-data rate I/O modules each having at least one pin dedicated to the DQS signal and others to DQ data signals. The modular architecture facilitates pin migration from one generation of PLDs to the next larger generation. While the above provides detailed description of specific embodiments, it is to be understood that various alternatives, equivalents and modifications are possible. Therefore, the scope of the invention should not be limited to the embodiments described, and should instead be determined by the following claims and their full breadth of equivalents.

What is claimed is:

1. A programmable logic device (PLD) comprising:
input/output (I/O) interface having a first plurality of I/O register blocks, the first plurality of I/O register blocks being partitioned into a second plurality of I/O sections each I/O section having N data I/O register blocks and a strobe circuit, wherein each of the N data I/O register blocks is configured to store multiple bits of data, and each strobe circuit is configured to generate a local strobe signal that drives a local clock line coupling to clock inputs of the N data I/O register blocks, the N data I/O register blocks and the strobe circuit in each I/O section being coupled to a corresponding number of device pins; and programmable logic circuitry coupled to the I/O interface.

2. The PLD of claim 1 wherein the strobe circuit in each I/O section is configured to shift a phase of an input strobe signal received at a respective strobe pin.

3. The PLD of claim 2 further comprising a master phase control circuit coupled to receive a master clock signal and configured to generate a phase control signal that controls a phase delay in the strobe circuit in one or more of the second plurality of I/O sections.

4. The PLD of claim 3 wherein the second plurality of I/O sections are grouped into a third plurality of I/O banks.

5. The PLD of claim wherein a separate master phase control circuit is provided for I/O sections in each of the third plurality of I/O banks.

6. The PLD of claim 1 wherein each I/O register block comprises two registers, one of which stores a first incoming bit of data at a rising edge of the local strobe signal and the other stores a second incoming bit of data at a falling edge of the local strobe signal.

7. The PLD of claim 6 wherein the strobe circuit in each I/O section comprises a programmable phase delay circuit that is configured to shift a phase of the local strobe signal such that an edge of the local strobe signal occurs substantially at the center of a data pulse.

8. The PLD of claim 7 wherein the phase delay is about 90 degrees.

9. The PLD of claim 1 wherein each I/O section further comprises one or more general purpose register blocks coupled to respective device pins.

10. (currently amended) The PLD of claim 1 wherein, in each I/0 section, the strobe circuit is located as close to a center of the N data I/O register blocks as possible wherein an equal number of data I/O register blocks are located on either sides of the strobe circuit.

11. The PLD of claim 1 wherein the programmable logic circuitry comprises a plurality of programmable logic blocks coupled via a network of a plurality of programmable vertical and horizontal interconnect lines.

12. A computing system comprising a multiple-data-rate memory circuit coupled to a programmable logic device (PLD) as set forth in claim 1.

13. The computing system of claim 12 wherein the multiple-data-rate memory circuit comprises a double data rate synchronous dynamic random access memory.

14. A method of operating a programmable logic device (PLD) comprising:

receiving N groups of data bits each group having M data signals and a corresponding data strobe signal;

partitioning I/O register blocks inside the PLD into a corresponding N I/O modules, each module having M I/O register blocks and a strobe circuit coupled to receive a respective group of M data signals and data strobe signal; and driving clock inputs of the M I/O register blocks in each of the N I/O modules using an independent clock network that is local to each of the N I/O modules.

15. The method of claim 14 further comprising programmably shifting a phase of the data strobe signal before driving the clock inputs of the M I/O register blocks.

16. The method of claim 15 wherein the programmably shifting of the phase of the data strobe comprises generating phase control signal in response to a system clock.

* * * * *

UNITED STATES PATENT AND TRADEMARK OFFICE
CERTIFICATE OF CORRECTION

PATENT NO. : 6,806,733 B1
APPLICATION NO. : 10/038737
DATED : October 19, 2004
INVENTOR(S) : Philip Pan et al.

It is certified that error appears in the above-identified patent and that said Letters Patent is hereby corrected as shown below:

In the specification, column 3, line 45, please delete "vis a vis" and insert --vis a' vis--.

In the specification, column 3, line 50, please delete "registers".

In claim 5, column 6, line 38, between the words "claim" and "wherein" please insert --4--.

In claim 10, column 6, line 56, please delete "(currently amended)".

In claim 10, column 6, line 60, please delete "sides" and insert --side--.

In claim 16, column 8, lines 9-10, between the words "generating" and "phase" please insert --a--.

Signed and Sealed this

Eighth Day of April, 2008

JON W. DUDAS
*Director of the United States Patent and Trademark Office*